United States Patent [19]

Bingham et al.

[11] Patent Number: 4,897,774
[45] Date of Patent: Jan. 30, 1990

[54] INTEGRATED DUAL CHARGE PUMP POWER SUPPLY AND RS-232 TRANSMITTER/RECEIVER

[75] Inventors: David Bingham, San Jose; Charles M. Allen, Sunnyvale, both of Calif.

[73] Assignee: Maxim Integrated Products, Sunnyvale, Calif.

[21] Appl. No.: 271,160

[22] Filed: Nov. 14, 1988

Related U.S. Application Data

[63] Continuation of Ser. No. 13,648, May 12, 1987, Pat. No. 4,809,152.

[51] Int. Cl.⁴ .................................................. 02M 7/25
[52] U.S. Cl. ........................................ 363/61; 307/110
[58] Field of Search ............................. 363/59, 60, 61; 307/110; 320/1; 357/51

[56] References Cited

U.S. PATENT DOCUMENTS

| | | | |
|---|---|---|---|
| 3,470,443 | 9/1969 | Berry et al. | 363/62 |
| 3,731,112 | 5/1973 | Smith | 307/109 |
| 3,878,450 | 4/1975 | Greatbatch | 363/60 |
| 3,942,047 | 3/1976 | Buchanan | 307/296.6 |
| 3,943,428 | 3/1976 | Whidden | 363/60 |
| 3,955,353 | 5/1976 | Astle | 368/157 |
| 3,975,671 | 8/1976 | Stoll | 363/60 |
| 4,047,091 | 9/1977 | Hutchines et al. | 363/60 |
| 4,061,929 | 12/1977 | Asano | 307/246 |
| 4,068,295 | 1/1978 | Portmann | 363/60 |
| 4,106,086 | 8/1978 | Holbrook et al. | 363/60 |
| 4,186,436 | 1/1980 | Ishiwatari | 363/60 |
| 4,321,661 | 3/1982 | Sano | 363/60 |
| 4,460,952 | 7/1984 | Risinger | 363/61 |
| 4,485,433 | 11/1984 | Topich | 363/60 |

FOREIGN PATENT DOCUMENTS

| 0080264 | 5/1982 | Japan | 363/60 |
|---|---|---|---|
| 0951602 | 8/1982 | U.S.S.R. | 363/60 |

Primary Examiner—Patrick R. Salce
Assistant Examiner—Judson H. Jones
Attorney, Agent, or Firm—Blakely, Sokoloff, Taylor & Zafman

[57] ABSTRACT

A monolithic integrated circuit containing an inverting/non-inverting voltage doubler charge pump circuit is disclosed for converting a unipolar supply voltage to a bipolar supply voltage of a greater magnitude. The unipolar input voltage is placed across a first external transfer capacitor by a first set of MOS switches during a first time period. The unipolar input voltage source is placed in series with the first transfer capacitor and this series combination of voltages is placed across a first external reservoir capacitor by a second set of MOS switches during a second time period. The voltage appearing across the first external reservoir capacitor is placed on a second transfer capacitor during the first time period by a third set of MOS switches. The voltage across the second transfer capacitor is placed into a second external reservoir capacitor with its polarity inverted by a fourth set of MOS switches during the second time period. A dual-collector lateral junction transistor, formed during the conventional CMOS processing steps used to fabricate the MOS switches, is connected as a voltage clamp between a ground potential and the two bipolar DC output lines of the power supply circuit to assure correct start-up conditions for the circuit. Gain reduction devices are placed in the semiconductor substrate to collect minority carriers which would otherwise be injected into inherent parasitic four layer PNPN junction devices created as a result of the architecture of the circuit, to prevent latch-up of the four layer devices. In a preferred embodiment, an RS-232 receiver and transmitter are contained on the same monolithic integrated circuit as the dual charge pump power supply.

4 Claims, 5 Drawing Sheets

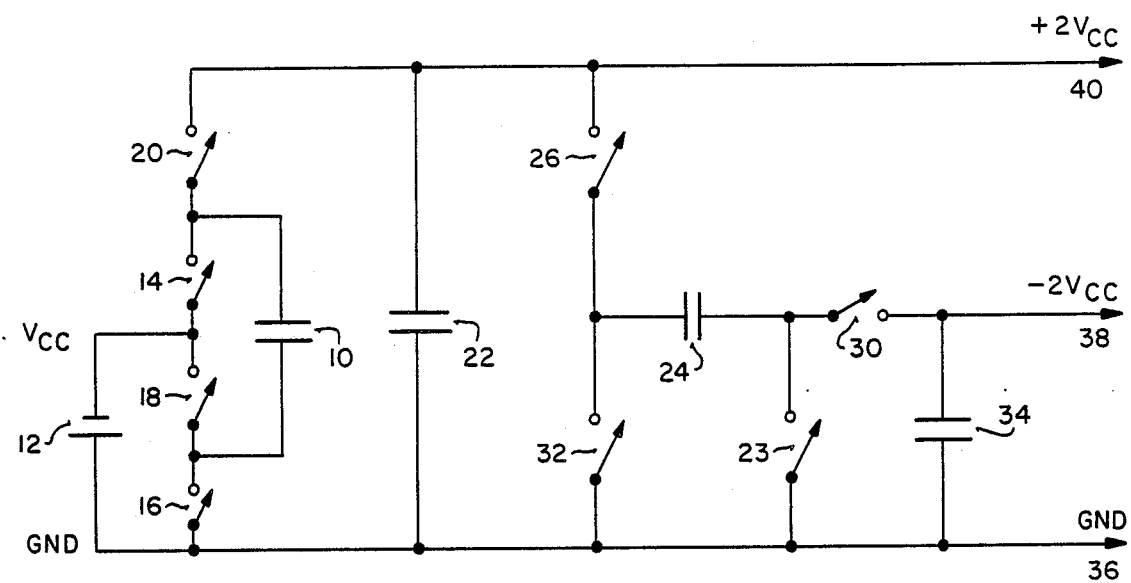
FIG_1A
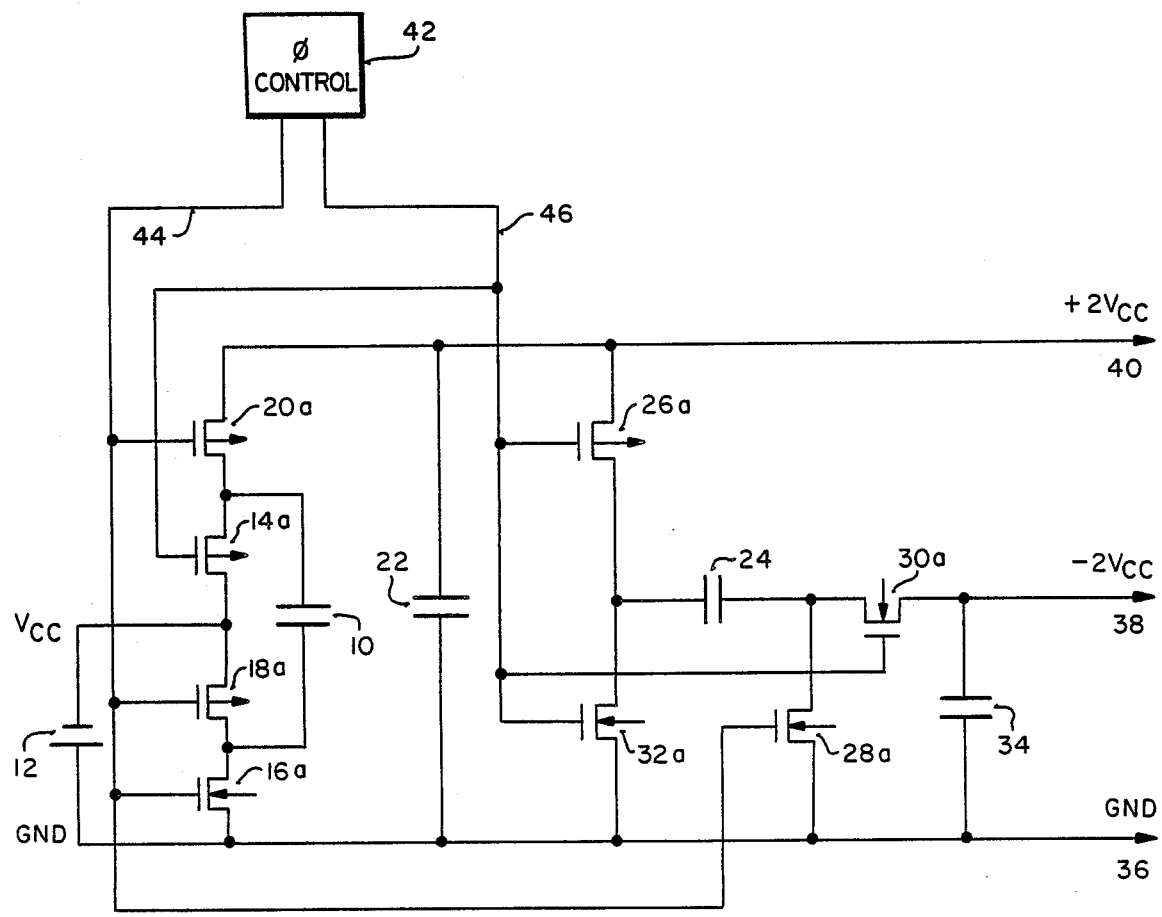
FIG_1B

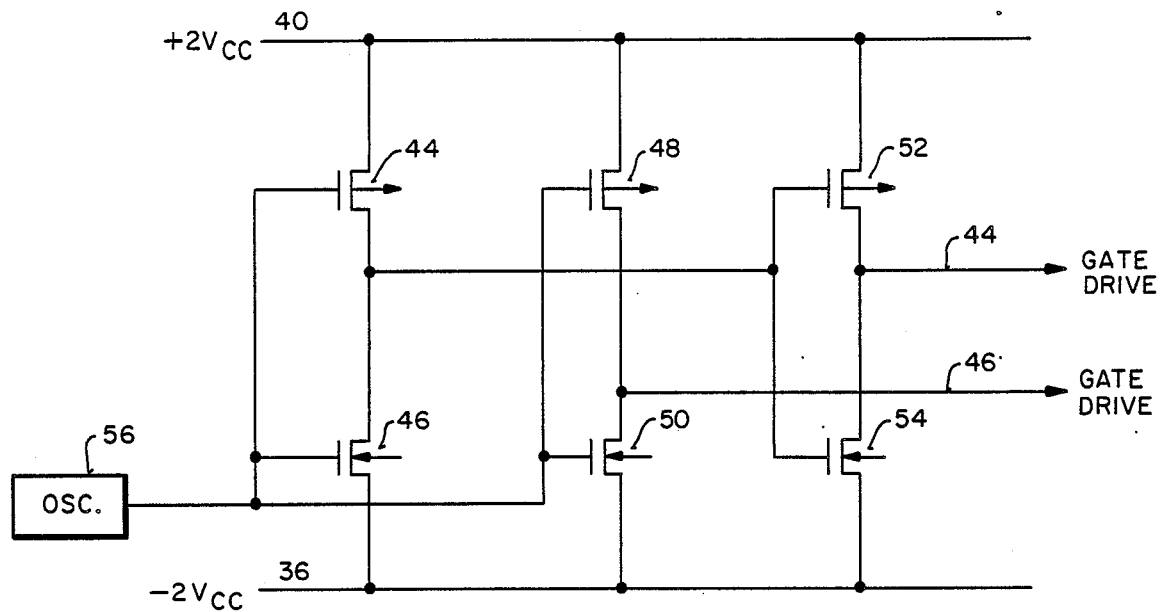
FIG_2
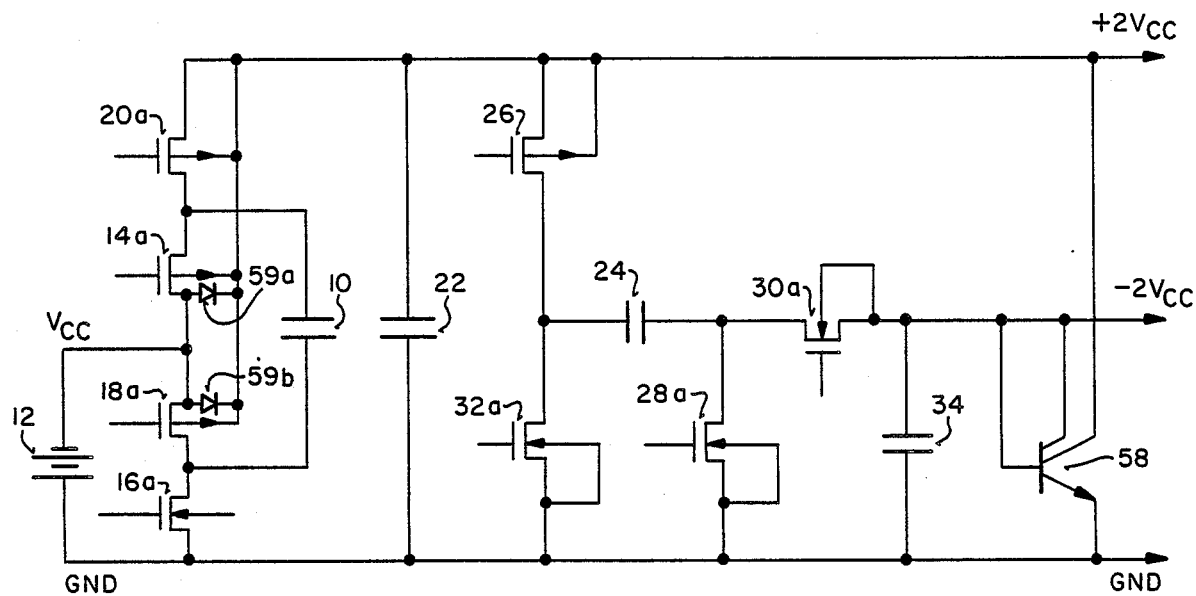
FIG_3

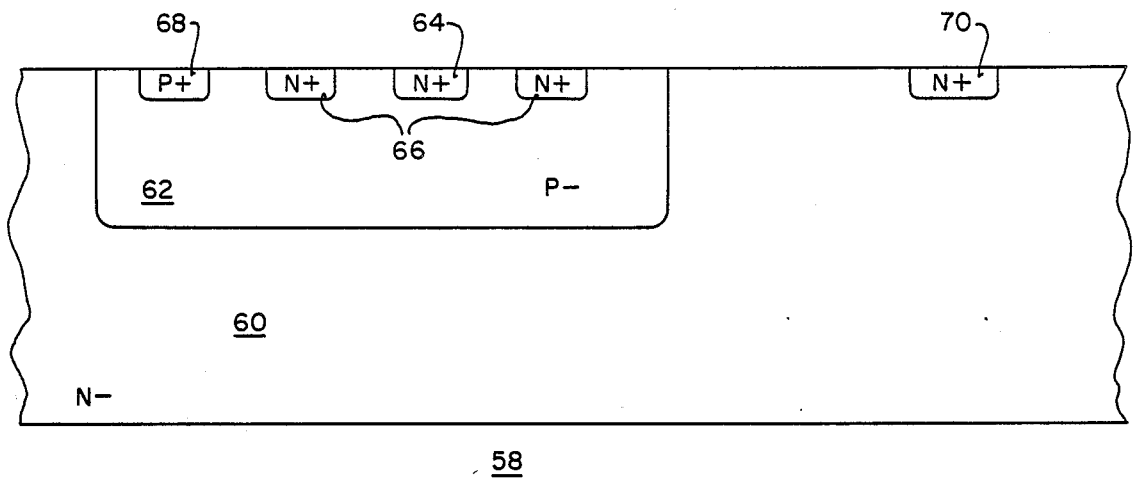
FIG_4
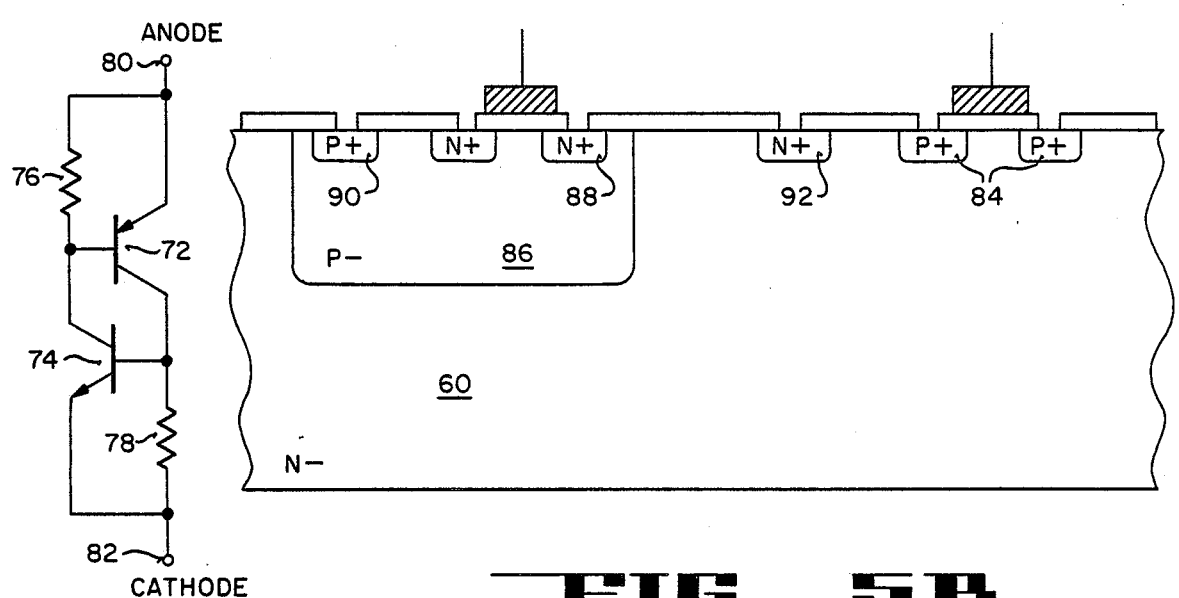
FIG_5A
FIG_5B

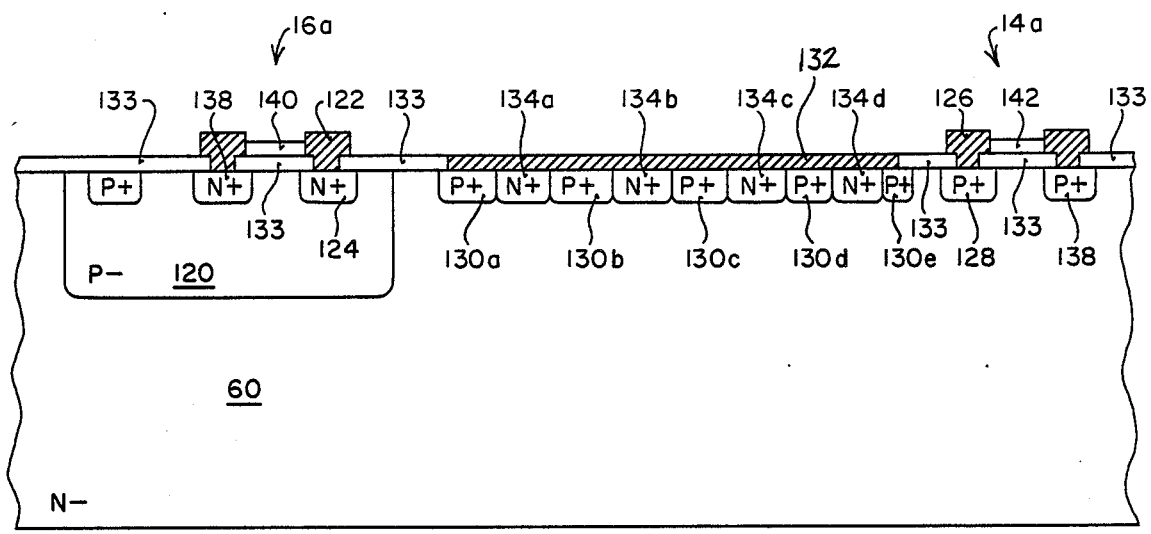
FIG_6B
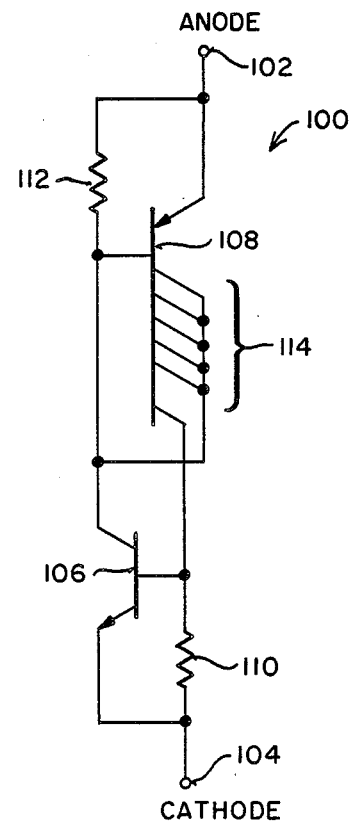
FIG_6A

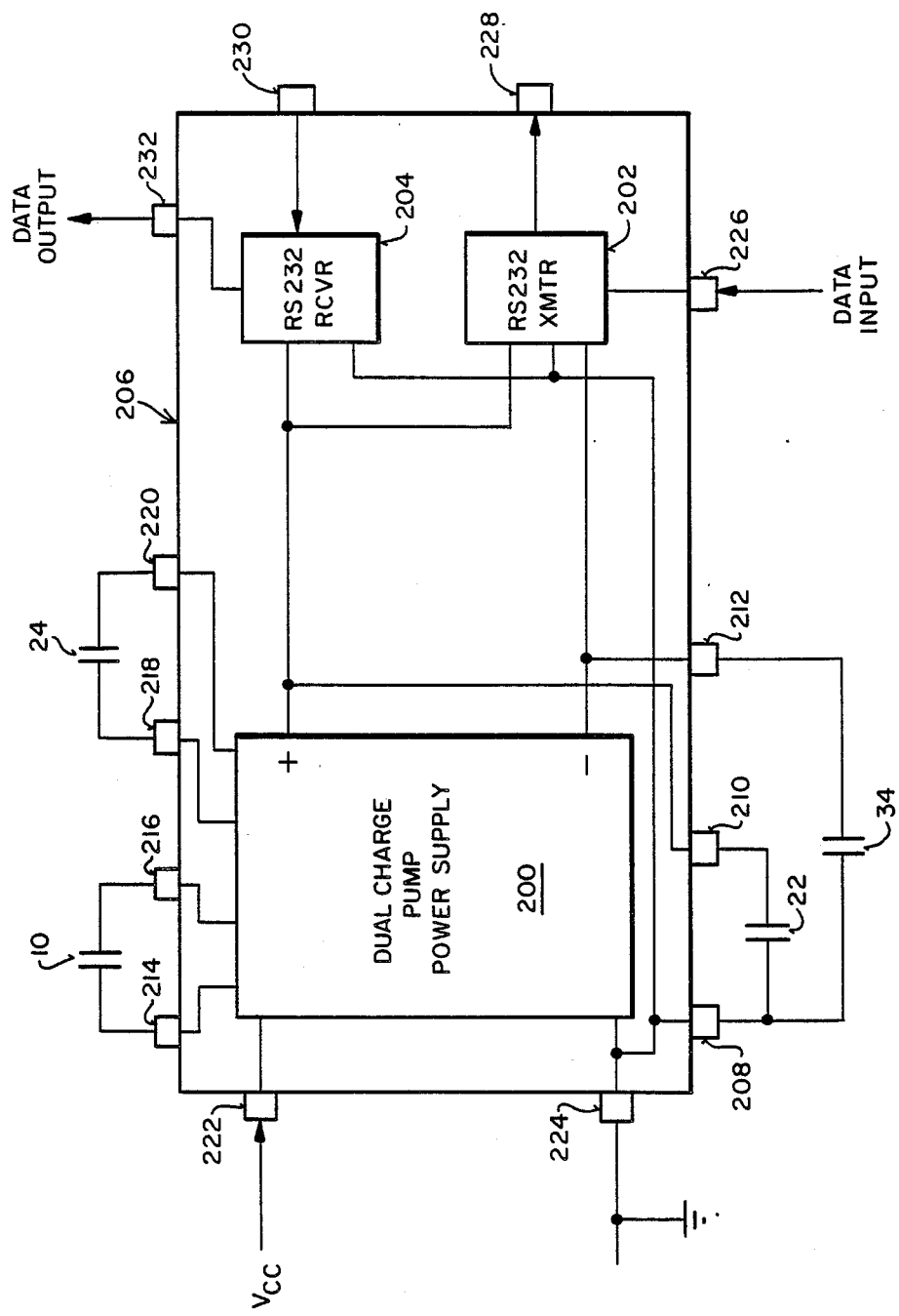
FIG_7

INTEGRATED DUAL CHARGE PUMP POWER SUPPLY AND RS-232 TRANSMITTER/RECEIVER

This is a continuation of application Ser. No. 07/013,648, filed May 12, 1987, now U.S. Pat. No. 4,809,152.

BACKGROUND OF THE INVENTION

1. Field of the Invention

The present invention pertains to charge pump power supplies for generating bipolar output voltages greater in magnitude than a single unipolar input voltage. More particularly, the present invention pertains to the integration of such a circuit on a single piece of semiconductor substrate material. Further, the invention pertains to other circuitry integrable on a single piece of semiconductor substrate material along with such a power supply circuit.

2. Prior Art

Discrete component voltage doubler and voltage inverter circuits are well known in the art. Such circuits are used in many electronic systems which require a multiplicity of DC voltages for operation. More recently, in the context of digital circuits and systems, it has become common to employ a single five volt unipolar voltage supply to power digital circuitry in modern data processing systems. For example, semiconductor microprocessors, memories, and logic all commonly operate from a single five volt power supply. There are however, certain interface circuits and other special purpose circuits which require voltages other than five volts. More particularly, some circuits require voltages in the ranges of from five to fifteen volts. Additionally, requirements often exist for bipolar power supply voltages so that voltage power requirements of plus or minus 15 volts and plus or minus 12 volts are commonly encountered, for example in RS-232 communication loops.

For these communication circuits and other applications, bipolar DC power requirements are low when compared to the digital circuitry power requirements. In fact, it is common to encounter five volt unipolar power supplies for driving digital logic rated in tens or hundreds of watts whereas interface and other power requirements may be as low as tens or hundreds of milliwatts.

It is therefore often desirable to generate locally the various non-primary voltage sources, i.e., the bipolar voltage sources, if the power requirements are not high and if it can be done economically and with relatively high electrical power conversion efficiencies.

For an example, a minicomputer may have a 100 watt 5 volt power supply which supplies all of the requirements for a multiplicity of printed circuit boards holding logic integrated circuits. On one of those integrated circuit boards, there will often be an RS-232 digital interface circuit requiring a plus or minus 10 or plus or minus 15 volt power supply. This interface circuit may consume 50 milliwatts of power. Instead of generating the plus and minus 15 volt power supply from the main power supply and then bussing these voltages to the boards which require them, it is often more economical to generate these two voltages from the bussed five volt power supply locally on whatever board needs other voltages. However, generating such voltages by the use of discrete components is often disadvantageous because the additional components required to generate such voltages take up a relatively large amount of circuit board real estate, and often are power inefficient, i.e., heat producing.

The industry has recently turned its attention to attempts to furnish auxiliary power supplies of the nature herein described on a single semiconductor substrate. Such circuits have the obvious advantages of space saving, assembly labor savings, and relatively lower power dissipation. A form of such circuits known as charge pumps have been used in semiconductor memory chips to produce a crude back bias supply and for supplying the higher voltages needed to program such memory devices. Charge pump circuits have been used in the inverting mode to produce voltage polarities opposite to that of the supply voltage from which they are generated. An example of such a circuit is found in the product designated ICL 7660, a power supply circuit manufactured by the assignee of the present invention.

The efforts to design and implement a bipolar charge pump integrated circuit have met with several obstacles which result from the inherent nature of the integration process and the fabrication process which are used to manufacture these devices. It is well known to those in the art that when MOS or CMOS circuits are integrated onto a single semiconductor substrate, the chip layout geometry and architecture inherently produce parasitic junction devices. These devices include junction biodes, bipolar transistors, and PNPN four layer diode devices, similar to silicon controlled rectifier (SCR) devices.

The existence of these parasitic devices has created difficulties in the design and fabrication of dual polarity charge pump power supply circuits. When forward biased, the aforementioned four layer diode device will cause a CMOS circuit to experience a phenomenon known as latch-up. Latch-up is a phenomenon common to CMOS circuits whereby the circuit can be triggered into a low impedance conducting state by forward biasing an inherent four layer diode device in the circuit. This four layer diode may be triggered by various means into a low voltage, low impedance state. When this occurs, operation of the circuit is inhibited and possible damage may occur to the circuit if there is no inherent current limiting designed into the circuit.

Another problem inherent in the design of dual polarity charge pump inverter circuits is the difficulty of assuring correct start-up of the circuit. The conditions existing in the semiconductor material at the time of start-up may randomly produce states which prevent such a circuit from ever starting up to produce the desired output voltages. In the past, elaborate systems and considerable extra circuitry has been designed into such circuits in an attempt to avoid this problem.

BRIEF DESCRIPTION OF THE INVENTION

The present invention consists of a CMOS inverting and non-inverting charge pump power supply integrated into a single piece of semiconductor substrate material. An inherent lateral bipolar transistor formed during the CMOS fabrication process is utilized to always assure the correct operating conditions which will allow start-up of the circuit. In addition, the inherent four layer diode devices which are created during the fabrication of the circuit are identified during the geometry layout process which defines the locations on the semiconductor substrate where the various devices will be placed, and extra minority charge collector regions are placed in the semiconductor substrate to collect injected minority charge carriers and prevent the possibility of triggering the inherent four layer PNPN junction into a low impedance conducting or latch-up mode.

Another aspect of the present invention is the integration, on a single piece of semiconductor substrate material, of an inverting charge pump power supply, a non-inverting charge pump power supply, and a combination of RS-232C receivers and transmitters. Combination of RS-232C transmitters and receivers may consist of at least one transmitter together with either zero or any number of receivers.

BRIEF DESCRIPTION OF THE DRAWINGS

FIG. 1(a) is a simplified schematic diagram of the charge pump circuit of a preferred embodiment of the present invention.

FIG. 1(b) is a schematic diagram of the charge pump circuit of FIG. 1(a) wherein the switches are replaced by MOS transistors.

FIG. 2 is a gate drive circuit suitable for operating driving the gates of the charge pump circuit of FIG. 1(b).

FIG. 3 is a schematic diagram of a preferred embodiment of the present invention further showing the substrate connection of the MOS devices and a PNP lateral junction device for assuring the correct start-up conditions of the charge pump circuit.

FIG. 4 is a semiconductor substrate profile drawing of NPN lateral transistor suitable for use in the present invention.

FIGS. 5(a) and 5(b) are respectively a schematic representation of a four layer device and a semiconductor substrate profile drawing of such a device showing the MOS geometry which inherently creates such a device.

FIG. 6(a) is a schematic diagram of a four layer device having extra P region collectors, suitable for use in the present invention.

FIG. 6(b) is a substrate profile drawing of a four layer device suitable for use in the present invention having extra minority charge carrier collectors for preventing latch-up showing the relative placement of such charge collectors.

FIG. 7 is a block diagram of an embodiment of the present invention including a dual integrated charge pump power supply and a RS-232C receiver and transmitter.

DESCRIPTION OF A PREFERRED EMBODIMENT

Referring first to FIG. 1(a), simplified conceptual schematic drawing of the basic charge pump circuit of the present invention, the circuit of the present invention operates by placing an input voltage upon one of the two transfer capacitors via a series of switches. The charge in that capacitor is then transferred to one of two reservoir capacitors. The polarity of the voltage is established via the switch interconnecting scheme.

More specifically, the operation of the circuit of FIG. 1(a) is time-divided into two segments, or phases. In a first phase, voltage from a voltage source is placed on transfer capacitors. During a second phase the voltage on the transfer capacitors is transferred to the reservoirs capacitors.

Referring first to the positive voltage doubler portion of the circuit, transfer capacitor 10 is charged from voltage source 12 (having a value Vcc) by closing switches 14 and 16 while switches 18 and 20 remain open during a first phase. During a second phase switches 14 and 16 are open and switches 18 and 20 are closed.

As can be seen from FIG. 1(a), when switches 18 and 20 are closed during the second phase the voltage source 12 is effectively placed in series with the voltage stored across reservoir capacitor 10 and thus the sum of the voltage across voltage source 12 and capacitor 10 is placed across reservoir capacitor 22.

The inverting portion of the voltage doubler circuit operates as follows: transfer capacitor 24 is charged to the voltage across reservoir capacitor 22 via the switches 26 and 23 which are closed during the first phase of operation of the circuit while switches 30 and 32 remain open. During the second phase of circuit operation switches 26 and 23 are opened and the voltage across transfer capacitor 24 is placed on reservoir capacitor 34 via the closing of switches 30 and 32. Those of ordinary skill in the art will note that the circuit configuration is such that when the voltage across transfer capacitor 24 is placed across reservoir capacitor 34 the positive end of transfer capacitor 24 is connected to ground line 36 through switch 32 and the negative end of capacitor 24 is connected to the side of reservoir capacitor 34 connected to $-2$ Vcc output line 38. The polarity of the voltage across reservoir capacitor 34 with respect to ground line 36 is thus such that the voltage across reservoir capacitor 34 is negative. The output of reservoir capacitor 22 is connected to $+2$ Vcc output line 40.

The first and second phases of circuit operation described above are repeated at a frequency which may range from approximately 100 hertz to 100's of kilohertz or higher. It has been found that a frequency of approximately 15 K Hz performs satisfactorily for the purposes of the present invention.

The foregoing represents an idealized characterization of the operation of the circuit of FIG. 1(a). Those of ordinary skill in the art will readily realize that it will take several first and second phase cycles before the resultant voltage between ground terminal 36 and $+2$ Vcc output terminal 40 actually reaches a voltage value of $+2$ Vcc. Likewise, it will be appreciated that several cycles are also needed for the voltage between ground terminal 36 and $-2$ Vcc output terminal 38 arrives at a voltage of $-2$ Vcc.

Those of ordinary skill in the art will also realize that the amount of current which may be drawn from the output of the circuit of FIG. 1(a) depends on the relative sizes of transfer capacitors 10 and 24 and reservoir capacitors 22 and 34, as well as the on impedance of switches 14, 16, 18, 20, 26, 28, 32 and 30.

It will also be apparent that the voltage appearing between output terminals 36 and 38 or 36 and 40 will be approximately twice the input voltage supplied by voltage source 12. Those of ordinary skill in the art will appreciate that other multiples of the input voltage Vcc at voltage source 12, are readily achievable using the concept of the present invention.

Turning now to FIG. 1(b), it is seen that in an actual embodiment of the present invention switches 14, 16, 18, 20, 26, 28, 30 and 32 have been replaced with MOS transistors. Thus, switch 14 is replaced by P-channel MOS transistor 14 (a), switch 16 is replaced by N-channel MOS transistor 16(a), switch 18 is replaced by P-channel MOS transistor 18(a), switch 20 is replaced by P-channel MOS transistor 20(a), switch 26 is replaced by P-channel MOS transistor 26(a), switch 28 is replaced by N-channel MOS transistor 28(a), switch 30 is replaced by N-channel MOS transistor 30(a), switch 32 is replaced by N-channel MOS transistor 32(a).

The time controlled operation of the circuit of FIG. 1(b) is implemented by phase control unit 42. Phase control unit 42 drives all of the gates of the MOS devices, 14(a), 16(a), 18(a), 20(a), 26(a), 28(a), 30(a), and 32(a) via gate control lines 44 and 46. Gate control lines 44 and 46 are connected to the gates of the P-channel MOS transistors and N-channel MOS transistors, used as MOS switches, such that the switches are turned on and off appropriately as described herein during the first and second phases of the circuit operation.

Those of ordinary skill in the art will readily appreciate that, in order to insure efficient power transfer, that switching of MOS switching devices should be accomplished on a break before make basis or, at worst case, on a simultaneous switching basis. Those of ordinary skill in the art will also realize that the order of phases could be reversed. Alternatively, a first clock could be used to control the sets of MOS switches controlling transfer capacitor 10 and reservoir capacitor 22, and a second clock could be used to control the sets of MOS switches controlling transfer capacitor 24 and reservoir capacitor 34.

It should be understood for purposes of this disclosure, that all of the capacitors shown in FIGS. 1(a) and 1(b) would be located outboard of the integrated circuit in an actual embodiment. That is, these capacitors are external components which connect to the integrated MOS switches on the semiconductor substrate via terminals provided on the semiconductor substrate for that purpose. For an operating frequency of 15 KHz, 20 microfarads is a sufficient size for all capacitors. Those of ordinary skill in the art will readily appreciate that as the switching frequency is increased the values of the capacitors will drop, but that switching losses will increase due to the changing to discharging at the clock rate of its parasitic nodal capacitances in the MOS devices. Conversely, as the switching frequency decreases, the size of the capacitors would increase, with the concomitant disadvantage that the increasing capacitor size is accompanied by increasing physical size of the capacitors.

For a current capacity of 10 milliampere at +10 volts and −10 volts, the MOS switching devices should have a channel width to channel length ratio of 5000 to 10,000, with channel lengths of approximately five microns. Those of ordinary skill in the art will recognize that the range of current output of the circuit described herein could be as large as approximately one ampere, however, the MOS devices would have to be scaled accordingly as is well known in the art.

Referring now to FIG. 2, an embodiment of the phase control unit 42 of the present invention, the operation of phase control unit 42 is disclosed. Those of ordinary skill in the art will recognize that phase control unit 42 may consist of three conventional CMOS inverter circuits each comprised of a P-channel and N-channel MOS transistor pair. The embodiment of FIG. 2 contains a first CMOS inverter comprised of P-channel MOS transistor 44 and N-channel MOS transistor 46, the inverter comprised of P-channel MOS transistor 48 and N-channel MOS transistor 50, and the inverter comprised of P-channel MOS transistor 52 and N-channel MOS transistor 54.

These three inverter pairs are driven by oscillator 56, which may be any conventional oscillator configured from CMOS elements as is well known to those skilled in the art.

The circuit of FIG. 2 is powered by +2 Vcc and −2 Vcc lines 36 and 40. This assured that the voltage swing on gate lines 44 and 46 will span approximately the entire power supply range, thus ensuring that all of the gates of the P-channel and N-channel devices which they drive will be as fully turned on as possible and can be turned off since all transistors and enhancement types. This will guarantee as low an on-state impedance of the MOS switches as possible thus maximizing the efficiency and current drive capabilities of the present invention.

In the illustration of a preferred embodiment of the present invention depicted in FIG. 1(a), the substrate connections of the MOS devices are shown uncommitted. Those of ordinary skill in the art will realize that junction isolated MOS transistors such as used in FIG. 1(b) are four-terminal devices and that both the gate terminal and the substrate terminal are control terminals. The turn-on voltage of the gate terminal is affected by the reverse bias on the substrate to source junction. As that reverse bias is increased, the turn on voltage of the device also increases. The affect is significantly greater for an N-channel transistor than a P-channel transistor.

As the substrate-to-source voltage increases the gate turn voltage of the device also increases, thus potentially increasing the on resistance of the device to a point where circuit operation could be seriously effected. Since, in a circuit of this nature, the drain-source resistance in the on state should be as low as possible, it is desirable to connect each N-channel MOS transistor substrate to its source.

With respect to P-channel transistors the effect of this reverse substrate source biasing is about half of that for N-channel MOS transistors due to lighter channel impurity doping densities. The most practical solution in the case of the P-channel MOS transistors is to connect all P-channel substrates to the most positive voltage in the circuit. That voltage is, as seen from FIG. 1(a) +2 Vcc which appears on positive supply line 40. These connections are shown in respect to FIG. 3.

Prior to start-up, it is reasonable to assume that zero voltage exists on all capacitors. At start-up, reservoir capacitor 22 may be connected to ground line 36 or to −2 Vcc line 38. Reservoir capacitor 22 will be immediately charged with the source substrate diodes of P-channel MOS transistors 14(a) and 18(a) to a voltage of approximately Vcc −0.6 of a volt. The voltage on reservoir capacitor 34 could lie somewhere between ground line 36 and the voltage on reservoir capacitor 22; depending which of transistors 26(a), 28(a), 30(a) or 32(a) were conducting (if any). This results in a voltage on the −2 Vcc line that could be such that N-channel that transistor 16(a) and other transistors being turned on. Under these conditions, a voltage between +2 Vcc drives the gates of all of the output transistors and is indeterminate. Thus both start-up and operation is not assured.

If the other possible start-up conditions of the capacitor and MOS device connections and off/on states are assumed, those of ordinary skill in the art will readily appreciate that the start-up and operation of the circuit of FIGS. 1 and 2 is not assured.

The solution to this dilemma is to place a clamp on the −2 Vcc line 38 to clamp that voltage line to assure that it will never assume a voltage substantially more positive than that appearing on ground line 36. The +2 Vcc line 40 is also clamped so that it will never assume a voltage substantially more negative than the voltage Vcc on approximately Vcc −0.6 volts.

While those of ordinary skill in the art will realize that, conceptually, a diode would be an ideal clamping means for the −2 Vcc line 38, it is not possible to fabricate a simple PN junction diode in a MOS process. A junction transistor will always be created by an attempt to fabricate a diode. The presence of such a transistor in the circuit of FIG. 1(b) would cause excess wasted current to flow in the circuit, because of its beta or current gain.

In a preferred embodiment of the present invention, this clamp is comprised of a lateral NPN transistor. This lateral NPN transistor is shown in FIG. 3. The lateral collector and base of this device are both connected to −2 Vcc line 38, its vertical collector connected to +2 Vcc. The lateral collector serves to minimize the effective current gain of the unwanted but inherent vertical collector of NPN transistor 58, which would otherwise cause excess current flow from the +2 Vcc line through ground. Unless the −2 Vcc line 38 exceeds ground by approximately 0.6 of a volt in the positive direction, this device will not conduct current. If the −2 Vcc line equals approximately 0.6 volts, the device turns on and current will flow in approximately equal portions through both collectors to maintain the −2 Vcc line at no greater than zero plus approximately 0.6 volts.

With respect to the clamp for +2 Vcc line 40, the action of the inherent junction diodes 59(a) and 59(b) present between the drain and substrate of devices 14(a) and 18(a) serve to clamp the +2 Vcc line to a voltage no more negative than the input positive supply voltage Vcc minus approximately 0.6 volts.

Consequently the voltages on +2 Vcc line and −2 Vcc line are both well defined. Additionally the voltage difference between +2 Vcc line 38 and −2 Vcc line 40 at start-up is (Vcc −1.2) volts and is also well defined. This value of voltage is sufficiently large to guarantee operation of the drive circuitry for the gates of the output transistors until the charge pumps charge the lines +2 Vcc (40) and −2 Vcc (38) to those voltages.

The lateral NPN transistor used to clamp −2 Vcc line 38 is fabricated using conventional CMOS fabrication techniques. For a current drain of plus and minus 10 mA at 10 volts, the periphery of the emitter for the lateral NPN transistor can typically be 100 microns. Those of ordinary skill in the art will appreciate that the size of this device may be scaled to accommodate larger current carrying requirements, and its periphery need not be larger than 1000 microns.

Referring now to FIG. 4, a substrate profile drawing of a dual collector lateral NPN transistor 58, that transistor 58 is fabricated on a portion of the lightly doped N type substrate material 60 in a P-well 62. P-well 62 is placed into substrate 60 using common CMOS processing techniques. N region 64 serves as the emitter of the lateral NPN transistor, and is surrounded by N region 66 which serves as the lateral collector. P region 68 in P-well 62 serves as the base contact, it being understood by those skilled in the art that P-well 62 itself serves as the base of lateral NPN transistor 58. N-region 70 located in a region of substrate 60 outside of P-well 62 serves as the unwanted, but inherent vertical collector of NPN lateral transistor 58.

When the base emitter junction of lateral NPN transistor 58 is forward biased, minority carriers injected by the emitter into the base are collected by both the vertical and lateral collectors in roughly equal amounts. Connecting the lateral collectors to the common base reduces the vertical collector current to approximately ½ of the clamp current. If a vertical NPN transistor had been used alone, the clamp current (base current) would be multiplied by the beta (approximately 500 of the device) thereby wasting large amounts of current.

Referring now to FIGS. 1(b) and 3, during start-up reservoir capacitor 22 is charged by the forward biased condition of the source-substrate diodes 59(a) and 59(b) of P-channel device 14(a) and the drain substrate diode of P-channel device 18(a). The initial current surge through these diodes can be hundreds of milliamperes and thus be well above the holding current of the inherent SCR type four layer diode device which exists in the circuit.

Such a four layer device is schematically represented in FIG. 5(a). Referring to FIG. 5(a), it is seen that the four layer device is made up of PNP transistor 72, NPN transistor 74, resistor 76, and resistor 78. Resistor 76 is connected across the base-emitter junction of PNP transistor 72 while resistor 78 is connected across the base-emitter junction of PNP transistor 74. The base of NPN transistor 74 is connected to the collector of PNP transistor 72 and the base of PNP transistor 72 is connected to the collector of NPN transistor 74. The connection of the emitter junction of PNP transistor 72 and resistor 76 form the anode connection 78 of the four layer device and the intersection of resistor 78 and the emitter of NPN transistor 74 form the cathode connection 80 of the four layer device.

As will be appreciated by those of ordinary skill in the art, the four layer device shown in FIG. 5(a) will enter a low impedance state between its anode 80 and cathode 82 after suitable triggering if the product of the betas of the two equivalent transistors is greater than one and the anode current into the four layer device is greater than the turn on voltage of either transistor divided by its equivalent base emitter shunting resistor, whichever is greatest.

Referring now to FIGS. 3, 5(a) and 5(b), it will be apparent to those of ordinary skill in the art that such a four layer device occurs in the circuit of FIG. 3. The sources of either of P-channel devices 14(a) and 18(a) (shown diagrammatically as P region 84 in FIG. 5(b)) represent the emitter of PNP transistor 72 of FIG. 5. The semiconductor substrate 60 forms the base of PNP transistor 72 as well as the collector of NPN transistor 74. P-well 86 forms the collector of PNP transistor 72 as well as the base of NPN transistor 74. The source of either of N-channel transistors 16(a) and 32(a), one of which is shown as N region 88 of FIG. 5(b) forms the emitter of NPN transistor 74. Resistor 76 is formed by the bulk resistance of the P-well 86. Likewise, the resistor 78 is formed by the bulk resistance of the substrate material. Those skilled in the art will note that regions such as P region 90 in P-well 86 and N region 92 in substrate 60 serve as low resistance surface planes commonly used in CMOS technology to buss supply voltages to the surfaces of substrate and P-wells.

In order to trigger the four layer device into its low impedance state, currents must be injected into the base of either of transistors 72 or 74, either the P-well 86 or the substrate 60. These currents must be greater than the holding current required for the four layer device.

This condition can occur by various means. For example, a very rapid rate of increase in the anode-cathode voltage will force current into the bases of transistors 72 and 74 due to the charging of the collector-base junction capacitors inherent in those devices. Alternatively, forward biasing of a region in the substrate junction adjacent to the P-well 86 and P-region 84 forming the emitter of transistor 72 could induce base currents to flow in transistor 72 and 74 sufficient to exceed holding current values. Either of these conditions could occur at start-up of the circuit of FIG. 3.

In order for the inverting doubler charge pump circuit of the present invention to reliably operate, it is necessary to assure that this possible latch-up condition can never occur. One method which is used in some CMOS circuits to inhibit the possibility of latch-up would be to insert high value resistors in series with either or both of the emitters of NPN transistor 74 or PNP transistor 72. This method, however, in the present invention would result in an unacceptably high value of on impedance for the MOS switches.

Another method of assuring that the latch-up condition never occurs is disclosed as an aspect of the present invention. The product of the betas of PNP transistor 72 and NPN transistor 74 is mode less than unity. Thus, the current flowing between the anode terminal 80 and cathode terminal 82 of the four layer device will never reach a value great enough to equal the holding current necessary to sustain that device in its low impedance state.

Referring now to FIG. 6(a), another four layer device 100 composed of equivalent NPN and PNP transistors is shown. However, unlike the circuit of FIG. 5(a) the four layer device depicted in FIG. 6(a), having anode terminal 102 and cathode terminal 104, a single collector NPN transistor 106 and a multiple collector PNP transistor 108 as well as resistors 110 and 112. The multiple PNP collectors (shown at 114) are tied back to the base of the PNP transistor 108. Only a single multiple collector is connected to the base of NPN transistor 106. These collectors 114 are fabricated on substrate 60 in a region located between the emitter of NPN transistor 106 and the base of PNP transistor 108.

The function of the serial collectors 114 is to guard the forward biased PN junction formed between P regions 128 or 138 and substrate 60 by collecting the minority carriers which are injected into the substrate 60. These carriers are thus prevented from reaching the base of the PNP transistor 108 and assure that the beta product of these two transistors is less than unity. Most of the minority carriers injected into the substrate are collected by these serial collectors before they can diffuse and be collected by the P-well which is also the base of the NPN transistor. This may be designed to reduce the PNP beta to a value of less than the reciprocal of the NPN beta thereby preventing latch-up.

Referring now to FIG. 6(b), a semiconductor profile drawing of four layer device 100 of FIG. 6(a), NPN transistor 106 is formed in P-well 120. Contact 122, contacting N region 124 in P-well 120, constitutes cathode 104 of four layer device 100. This N region may be the source of either N-channel MOS transistor 16(a) or N-channel MOS transistor 32(a) from FIGS. 1 and 3. N region 124 forms the emitter of NPN transistor 106 and P-well 120 forms the base of NPN transistor 106. Substrate 60 forms the collector of NPN transistor 106, as well as the base of PNP transistor 112.

Contact 126, contacting P region 128 is at Vcc potential. P region 128 may be either the source of P channel MOS transistor 14(a) or the drain of P-channel MOS transistor 18(a) from FIGS. 1 and 3. P region 128 forms the emitter of PNP transistor 108.

P regions 130(a) through 130(e), in substrate 60, form the multiple collectors of PNP transistors 108 (shown at 114 in FIG. 6(a)). Multiple collectors 130(a) through 130(e) are connected together at the surface of the semiconductor substrate 60 by layer 132 which may be made of aluminum and fabricated during the metalization step of a conventional CMOS fabrication process. N regions 134(a) through 134(d), disposed in between P regions 130(a) through 130(e) are used for the purpose of making a low impedance contact between the +2 Vcc line and the substrate. P-well 120, the base of NPN transistor 106, also serves as the single collector of PNP transistor 108, as shown in FIG. 6(a). The regions 135, shown adjacent to layer 132, are the gate oxide layer of the MOS structures.

As is shown in FIG. 6(b) the multiple collectors of PNP transistor 114 are interposed in between the N-channel MOS transistor 16(a) in the P-well formed of N regions 124 and 136. This device, for illustration, shown as 16(a) on FIG. 6(b), has drain region 138 and gate 140. This device, for illustration, shown as 18(a) on FIG. 6(b), has drain region 138 and gate region 142. P-channel MOS transistor 14(a) formed of P region 128 and P region 138. In this manner these multiple collectors 130(a) through 130(e) are in a position to collect most of the minority carriers which are injected into the semiconductor substrate as a result of forward biasing at start-up of the parasitic PN junctions formed during the CMOS fabrication process.

Depending on the CMOS process used, the number of multiple collectors 114 may range from 1 to approximately 10. Furthermore, the spacing between the injecting PN junction and the nearest P-well should be typically anywhere from 25 to 500 microns. Spacing may be reduced if the lifetime of the substrate minority carriers is particularly low and or the substrate resistivity is very low (less than one ohm-centimeter). In the presently preferred embodiment the spacing between the injecting PN junctions and the nearest P-well is approximately 150 microns and four multiple collectors 114 are used. This is based upon a process using a substrate having a substrate resistivity of approximately 2.5 ohm-cm.

Although the presently preferred embodiment has been disclosed as a P-well CMOS embodiment, those of ordinary skill in the art will recognize that N-well CMOS technology could also be used without departing from the spirit and scope of the present invention. Those of ordinary skill in the art will readily understand from the disclosure herein how to fabricate such an N-well embodiment.

Referring now to FIG. 7, a block diagram of a preferred embodiment of the present invention including dual charge pump power supply 200, previously described, RS-232C transmitter circuit 202, and RS-232 receiver circuit 204. These elements are show diagrammatically as fabricated on a single piece of semiconductor substrate material 206. Positive reservoir capacitor 22 is shown connected to the semiconductor substrate via terminal pads 208 and 210. Negative reservoir capacitor 34 is shown connected to the substrate via terminal pads 208 and 212. Positive transfer capacitor 10 and negative transfer capacitor 24 are shown connected to the substrate via terminal pads 214, 216, 218 and 220 respectively. An input voltage is provided to the circuit at Vcc input terminal pad 222 and ground input terminal pad 224. Those of ordinary skill in the art will readily realize that ground input terminal 224 and terminal pad 208 may in some embodiments be the same connection terminal pad. The data input to RS-232 transmitter 202 is provided at terminal pad 226 and the output of RS-232 transmitter 202 is provided at terminal pad 228. The data input to RS-232 receiver 204 is provided at terminal pad 230 and the data output of RS-232 receiver 204 so provided at terminal pad 232.

A monolithic integrated circuit containing the dual charge pump power supply 200 and RS-232 transmitter 202 and receiver 204 may be fabricated as a monolithic integrated circuit. The only outboard components required for operation of the circuit are positive and negative reservoir capacitors 22 and 34 and the positive and negative transfer capacitors 10 and 24.

While the preferred embodiment of FIG. 7 shows a single RS-232 transmitter 202 and a single RS-232 transmitter 204, those of ordinary skill in the art will readily recognize that other combinations of receivers and transmitters could be added without departing from the spirit of the invention. It is noted, however, that an embodiment of the circuit of FIG. 7 which contains only one or more RS-232 receivers 204, and no RS-232 transmitters 202, does not require a negative power supply connection. This is because the negative swing of the RS-232 format signal is usually disregarded by the receiver circuitry.

The RS-232 transmitter circuit 202, as well as the RS-232 receiver circuit 204 may be conventionally configured out of CMOS elements as is well known in the art. For example, RS-232 transmitter circuit 202 may be a CMOS inverter with a level shifter to translate TTL logic levels to the RS-232 format, as is known in the art. Alternatively, it may be configured similarly to the MC 1488 circuit, manufactured by Motorola. RS-232 receiver circuits 204 may be a CMOS inverter with a level shifter to translate the incoming RS-232 format signal to TTL logic levels as is known in the art. Alternatively, it may be configured similarly to the MC 1489 circuit manufactured by Motorola.

A preferred embodiment of the present invention has been disclosed. Those of ordinary skill in the art will readily recognize that other embodiments are possible which do not differ in material respects. It is the intention of the inventors to include such embodiment within the scope of the appended claims.

We claim:

1. An integrated single-chip voltage supply comprising:
    a means adapted to be connected to a supply voltage for charging a capacitor approximately to a supply voltage;
    a means for coupling said charged capacitor in series with said supply voltage to create a source of positive voltage approximately double the supply voltage; and
    a means for inverting said doubled voltage and making it available on the same chip, thereby providing a source of two available supply voltages on the same chip, one being a positive voltage approximately two times said supply voltage, and the other being a negative voltage approximately two times said supply voltage.

2. The integrated single-chip voltage supply of claim 1 further characterized by said coupling means including a means for charging a second capacitor to approximately two times said supply voltage, and said inverting means including a means for inverting the positive doubled voltage on said second capacitor to provide an available negative voltage on the same chip in magnitude approximately twice said supply voltage.

3. An integrated voltage supply and RS-232 transmitter circuit or the same semiconductor chip, comprising:
    an RS-232 transmitter circuit;
    a means adapted to be connected to a supply voltage for charging a capacitor approximately to a supply voltage;
    a means for coupling said charged capacitor in series with said supply voltage to create a source of positive voltage approximately double the supply voltage;
    a means for inverting said doubled voltage and making it available on the same chip, thereby providing a source of two available supply voltages on the same chip, one being a positive voltage approximately two times said supply voltage, and the other being a negative voltage approximately two times said supply voltage; and
    means connecting said doubled voltage and said inverted doubled voltage to said RS-232 transmitter circuit for powering said RS-232 transmitter circuit.

4. The integrated single-chip voltage supply of claim 3 further characterized by said coupling means including a means for charging a second capacitor to approximately two times said supply voltage, and said inverting means including a means for inverting the positive doubled voltage on said second capacitor to provide an available negative voltage of magnitude approximately twice said supply voltage.

* * * * *

UNITED STATES PATENT AND TRADEMARK OFFICE
CERTIFICATE OF CORRECTION

PATENT NO. : 4,897,774
DATED : January 30, 1990
INVENTOR(S) : Bingham, et al

It is certified that error appears in the above-indentified patent and that said Letters Patent is hereby corrected as shown below:

On the title page, item

[63] Related U. S. Application Data

After "Continuation of Ser. No. 13,648, May 12, 1987, Pat. No. 4,809,152"

Insert -- , which is a continuation of Ser. No. 878,233, Jun. 25, 1986, Pat. No. 4,679,134, which is a continuation of Ser. No. 782,953, Oct. 1, 1985, Pat. No. 4,636,930.--

Signed and Sealed this

Fourteenth Day of September, 1993

Attest:

BRUCE LEHMAN

*Attesting Officer*     *Commissioner of Patents and Trademarks*